United States Patent [19]

Peterson

[11] 4,287,383

[45] Sep. 1, 1981

[54] CADMIUM SULFIDE PHOTOVOLTAIC CELL OF IMPROVED EFFICIENCY

[75] Inventor: Terry M. Peterson, El Cerrito, Calif.

[73] Assignee: Chevron Research Company, San Francisco, Calif.

[21] Appl. No.: 148,892

[22] Filed: May 12, 1980

Related U.S. Application Data

[63] Continuation-in-part of Ser. No. 106,818, Dec. 26, 1979, abandoned.

[51] Int. Cl.³ .................... H01L 31/06; H01L 31/18
[52] U.S. Cl. .................................. 136/260; 427/74; 357/30
[58] Field of Search ............ 136/89 CD, 260; 357/30; 427/74

[56] References Cited

U.S. PATENT DOCUMENTS

| | | | |
|---|---|---|---|
| 4,086,101 | 4/1978 | Jordan et al. | 136/260 |
| 4,159,914 | 7/1979 | Jordan et al. | 136/258 |

Primary Examiner—Aaron Weisstuch
Attorney, Agent, or Firm—D. A. Newell; A. Stephen Zavell

[57] ABSTRACT

Cadmium sulfide photovoltaic cells of improved efficiency comprising transparent metal conducting electrode layer, first cadmium semi-conductor layer, short-barrier layer, second cadmium sulfide semi-conductor layer, barrier layer and collecting metal electrode layer.

8 Claims, 1 Drawing Figure

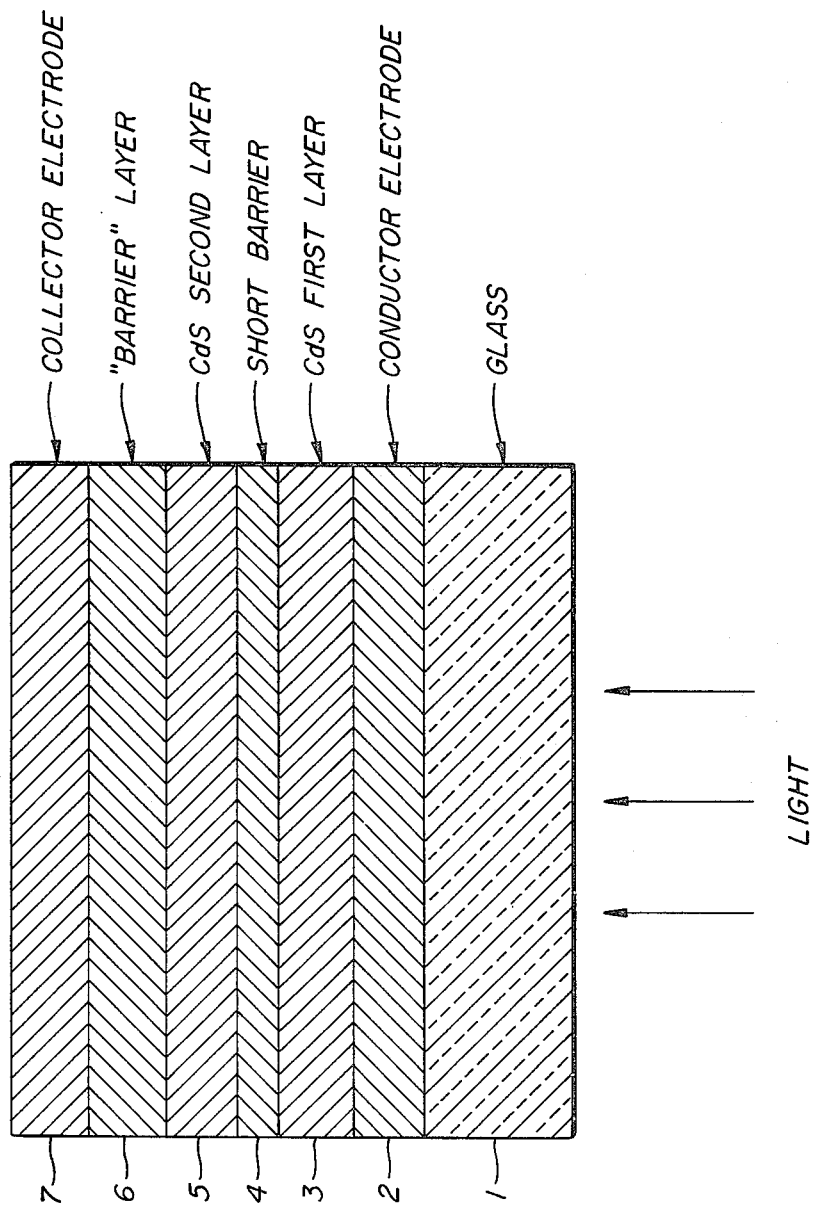

CADMIUM SULFIDE PHOTOVOLTAIC CELL OF IMPROVED EFFICIENCY

CROSS-REFERENCE TO RELATED APPLICATION

This application is a continuation-in-part of U.S. Ser. No. 106,818, filed Dec. 26, 1979 now abandoned.

BACKGROUND OF THE INVENTION

1. Field of the Invention

The present invention relates to cadmium sulfide photovoltaic cells of improved efficiency and resistance to short circuits. More particularly, the invention relates to cadmium sulfide cells having an increased voltage output characterized by a tri-layer construction in which the shortbarrier is a layer within the cadmium sulfide semi-conductor layer.

2. Description of the Prior Art

The preparation of cadmium sulfide thin film photovoltaic cells in general is well known. However, a great deal of research effort is still expended in the development and improvement of such photovoltaic cells in order to provide greater cell efficiency and economic feasibility.

U.S. Pat. No. 2,820,841 concerns a typical polycrystalline cadmium sulfide photovoltaic cell comprising a cadmium sulfide layer, a photovoltaic barrier layer, usually copper sulfide, a conducting electrode layer, and a collecting electrode layer.

U.S. Pat. No. 3,880,633 concerns the continuous fabrication of photovoltaic cells by spray deposition of materials on a glass substrate in which a transparent tin oxide layer is applied to the glass as the conducting electrode layer, followed by spraying cadmium chloride and N,N-dimethylthiourea aqueous solution doped with aluminum chloride over the transparent tin oxide conducting electrode layer.

U.S. Pat. No. 4,086,101 concerns cadmium sulfide photovoltaic cells in which short circuits caused by copper migration through the cadmium sulfide layer are inhibited by incorporating aluminum throughout the cadmium sulfide layer.

U.S. Pat. No. 4,143,235 concerns cadmium sulfide photovoltaic cells having improved efficiency due to a cadmium sulfide bi-layer formed by depositing at a first temperature an initial layer of cadmium sulfide in contact with a substrate layer and depositing a second layer of cadmium sulfide at a second temperature which is at least about 20° C. different than the first deposition temperature.

The prior art developments as discussed above have resulted in improvements in the efficiency and economics of thin film cadmium sulfide photovoltaic cells, including their resistance to short circuits. However, there is a continuing need for improvement of the efficiency of such cadmium sulfide photovoltaic cells.

SUMMARY OF THE INVENTION

It has been found that cadmium sulfide photovoltaic cells of improved efficiency are provided comprising successive layers of a transparent conducting electrode layer, a first cadmium sulfide semi-conductor layer, a short-barrier layer, a second cadmium sulfide semi-conductor layer, a barrier layer and a collecting metal electrode layer.

It has also been found that improved efficiency thin film polycrystalline polyvoltaic cells are prepared by the process which comprises forming a first cadmium sulfide semi-conductor layer on a transparent conducting electrode layer, forming an aluminum-containing short-barrier layer on said first cadmium sulfide semi-conductor layer, forming a second cadmium sulfide semi-conductor layer on said aluminum-containing short-barrier layer, forming a copper sulfide barrier layer on said second cadmium sulfide semi-conductor layer, and forming a copper collecting electrode layer.

The thin film polycrystalline cadmium sulfide photovoltaic cells of the present invention have been found to have improved efficiency, as evidenced by voltage, compared to other cadmium sulfide photovoltaic cells which do not have the tri-layer short-barrier construction.

BRIEF DESCRIPTION OF THE DRAWING

The essential nature of the improved cadmium sulfide photovoltaic cells of the present invention will be more readily understood when taken into consideration with the accompanying drawing. The drawing shows a schematic cross-sectional view of a photovoltaic cell embodying one mode of the present invention. Although the cross-sectional view shows the "backwall" type, in which the light source enters through the substrate, other arrangements are possible, including the "frontwall" type, in which the light source enters through a metal collector electrode grid.

DETAILED DESCRIPTION OF THE INVENTION

Polycrystalline cadmium sulfide thin film photovoltaic cells in general have been described in the above-mentioned prior art. In particular, U.S. Pat. No. 3,880,633 and U.S. Pat. No. 4,143,235 describe the use of spray depositions to form the layers of suitable cadmium sulfide photovoltaic cells. The disclosures of the aforementioned patents are hereby incorporated by reference since they describe the details of the manufacture of suitable polycrystalline cadmium sulfide photovoltaic cells.

The cadmium sulfide photovoltaic cells of the present invention typically comprise a number of layers which have been referred to as substantially coextensive planar laminations. The layers are arranged in the form of a first or bottom layer, which is a supporting substrate, which may be glass in the case of "backwall" cells. The second or next layer is a conducting transparent electrode layer, which may be a thin film of tin oxide or indium oxide, for example. The third layer is a semiconductor layer, which may be cadmium sulfide or cadmium, zinc sulfide, for example. The fourth layer is a short-barrier layer comprising the material of the third layer plus a minor proportion of aluminum. The fifth layer is a semi-conductor layer similar to the third layer. The sixth and next layer is a barrier layer, which may be copper sulfide, zinc phosphide, or copper indium selenide. The seventh and last layer is typically the metal collecting electrode layer, which in the present invention is preferably copper, copper alloys, or metallic compounds of copper or mixtures thereof.

The layers or substantially coextensive planar laminations of the polycrystalline photovoltaic cells of the invention may be arranged in an alternative sequence in the case of "frontwall" cells. In such an alternate the illumination enters through a typical metal electrode grid to the barrier layer, which is supported by the underlying semiconductor layers and the substrate. In such an alternate the grid and the metal substrate serve as the electrodes of the cell.

The preferred short barrier comprises aluminum which may be in the form of aluminum oxide or sulfide, or a mixture of both. However, other metals may be used for this purpose; these include: titanium, chromium, vanadium, boron, magnesium, beryllium, and scandium. Throughout this application, aluminum is used as illustrative of the short-barrier composition. The molar ratio of cadmium to aluminum in the short barrier ranges from 1:1 to 9:1.

It has been found that the efficiency of the cadmium sulfide photovoltaic solar cell can be improved using a trilayer structure comprising a first layer of cadmium sulfide in interfacial contact with a substrate layer, a thin short-barrier layer, and a second layer of cadmium sulfide. The short-barrier layer comprises cadmium sulfide containing a small amount of aluminum. Such layers are formed by depositing a mixture of cadmium and aluminum on the cadmium sulfide layer. Preferably aqueous solutions containing soluble cadmium and aluminum salts along with a source of sulfur are sprayed onto the cadmium sulfur layer.

This invention is based on the surprising discovery that the efficiency of the cadmium sulfide photovoltaic cell, as measured by output voltage, can be significantly increased by imbedding the short-barrier layer within the cadmium sulfide layer, rather than having it adjacent to the cadmium sulfide layer as heretofore practiced. Thus, the photovoltaic cell of this invention comprises three interfacial layers formed by the deposition of first, a first cadmium sulfide layer upon a supporting substrate; second, a short-barrier layer in interfacial contact with the cadmium sulfide layer; and third, a second cadmium sulfide layer in interfacial contact with the short barrier layer.

The relative thickness of the three layers making up the tri-layer photovoltaic cell of this invention range from 2:1:2 to 500:1:500, for CdS-short-barrier:CdS, respectively. The short-barrier layer must be continuous and without break, but is preferably thin. In general, it will have a thickness in the range of 1 to 200, preferably 5 to 100 nanometers. The entire three-layer, short-barrier, sandwich-type cell may vary widely in thickness, generally from about 1 to 8, preferably 3 to 6 micrometers.

Cadmium sulfide photovoltaic cells generally consist of a laminated composite structure having six substantially coextensive planar laminations. The six laminations are: (1) a supporting substrate, (2) a conducting electrode, (3) a short-barrier layer, (4) a cadmium sulfide layer, (5) a copper sulfide layer (sometimes called a "barrier" layer), and (6) a collecting electrode. In accordance with the instant invention, a new lamination has been added: A cadmium sulfide layer has been inserted between the conducting electrode and the short-barrier. As discussed herein, the two cadmium sulfide layers and the intermediate short-barrier layer, having a sandwich-type structure, are collectively referred to as the tri-layer. The cadmium sulfide portions of the tri-layer may be of different thicknesses and optionally contain minor amounts of other elements as dopants, additives, etc.

Referring to the drawing, a photovoltaic cell which has been fabricated according to this invention is illustrated in a cross-sectional view. The thickness dimension of the laminations is greatly exaggerated for clarity.

Reference numeral 1 refers to the lowermost lamination, which is primarily a supporting substrate and consists, for example, of plate glass.

The next layer or lamination, numeral 2, is an electrically conductive layer and is the conducting or negative electrode. This layer must be a chemically inert substance, capable of withstanding high temperatures and transparent to those wavelengths of sunlight to which the photovoltaic junction is sensitive. Typical substances for this lamination are stannic oxide, cadmium stannate, cadmium oxide, indium oxide, or mixtures thereof. The preferred substance is a mixture of indium oxide and tin oxide, frequently referred to as indium-tin oxide. Glass already coated with a conducting substrate is available commercially under the trade name "NESA".

The next three laminations, numerals 3, 4 and 5, form the tri-layer of this invention. Lamination 3 is a cadmium sulfide layer, lamination 4 is an aluminum-containing cadmium sulfide short-barrier layer, and lamination 5 is a cadmium sulfide layer.

In order to complete the photovoltaic junction, the tri-layer is substantially coextensive with a thin film (lamination numeral 6) of about 0.01 to 1.0 micron in thickness of a chalcogen of a monovalent metal from Group IB of the Periodic Table of the elements. Thus, the oxides, selenides, or sulfides of copper, silver, and gold are contemplated. Preferably, the layer is made of copper sulfide. Frequently, this lamination is referred to as a "barrier layer". Finally, there is an uppermost collector electrode lamination. This collector or positive electrode is made of a material which is capable of making ohmic or nonrectifying contact with the barrier layer. Suitable materials include: copper, indium, gallium, aluminum, chromium, etc.

The photovoltaic cell of this invention is fabricated by known methods which include: spray pyrolysis, vacuum deposition, sputtering, and the like. The preferred process is by spraying as taught in U.S. Pat. No. 3,880,633.

EXAMPLES

The following examples illustrate a preparation of photovoltaic cells of the present invention. These cells are then compared with cells of the prior art and shown to be more efficient.

EXAMPLE 1

A 6 ½-in. sq. piece of indium-tin oxide coated glass (resistance = 7.14 ohms/sq.) was cleaned with acid and then with water. After drying, it was placed in a molten tin bath maintained at 250° C. This bath was placed in a dry box under a nitrogen atmosphere. Then the tin bath temperature was raised to 400° C.

The glass was sprayed with a solution composed of 65 ml of 0.5 M cadmium dichloride and 38.4 ml of 1.0 M N,N-dimethylthiourea dissolved in 1000 ml of deionized water at a rate of 3 ml per minute for 40 minutes. Next, the above treated glass was sprayed with a solution composed of 12 ml of 0.5 M cadmium dichloride, 4 ml of 0.5 M aluminum trichloride, and 10.8 ml of 1.0 M N,N-dimethylthiourea dissolved in 250 ml of deionized water at the same rate for 2 minutes. Finally, the first solution was sprayed as before for 220 minutes. In the above spraying operation, nitrogen gas was passed through the spray nozzle to assist in producing a fine spray.

The resulting tri-layer film on glass was heated in an oven at 475° C. for 30 minutes, and then cooled slowly to room temperature on a hot plate.

The heat treated product was cut into 1-in. by 1-⅜-in. sections. Each section was dipped into an 80° C. solution composed of 5.24 g of potassium chloride, 4.9 g of hydroxylamine hydrochloride, and 3.6 g of copper chloride dissolved in 700 ml of deionized water. Sections were dipped for 3, 4, or 6 seconds. These sections were then heated in an oven at 220° C. for 10 minutes. Then a copper electrode was applied to the cell. The electrode was 0.1 cm$^2$ in area and consisted of a lower layer of copper vacuum evaporated into the copper sulfide, followed by a layer of gold evaporated onto the copper. The gold was to protect the copper from oxidation by air. The cell prepared in this way had a tri-layer structure mounted on the ITO glass support and consisted of, in sequence: a cadmium sulfide layer, a short-barrier layer, and another cadmium sulfide layer. These layers were in thickness ratios of 20:1:110, respectively. This tri-layer was capped by a copper sulfide layer on which was mounted a copper electrode. These cells were tested for electricity production with a water-filtered artificial light. The power produced per sq. cm, the open circuit voltage, and the short-circuit current were all measured. See Table I.

A comparative cell was made in an analogous manner as above, except that the first layer of the above process was skipped. This produced a bi-layer structure on a glass support comprising a barrier layer and a cadmium sulfide layer. It was tested under the same conditions as the previous cell. The results are given in Table I.

Other tri-layer cells were prepared in essentially the same way, except that the thickness of the three layers was varied; and both thiourea and N,N-dimethylthiourea were used as sources of sulfur. The results are given in Table I.

TABLE I

COMPARISON OF DI-LAYER AND TRI LAYER SOLAR CELLS

| Number of Layers | Relative Thickness | Sulfur Source[1] | Dipping Time (Sec.) | Ouput (Volts) |
|---|---|---|---|---|
| 2 | 1:115 | DMT | 3 | 0.295 |
|   |       |     | 4 | 0.358 |
|   |       |     | 6 | 0.304 |
| 3 | 20:1:110 | DMT | 3 | 0.375 |
|   |          |     | 4 | 0.388 |
|   |          |     | 6 | 0.379 |
| 2 | 1:115 | TU | 3 | 0.277 |
|   |       |    | 4 | 0.338 |
|   |       |    | 6 | 0.286 |
| 3 | 20:1:125 | TU | 3 | 0.353 |
|   |          |    | 4 | 0.324 |
|   |          |    | 6 | 0.354 |

[1]DMT = N,N-dimethylthiourea, TU = Thiourea.

A comparison of data from the tri-layer and bi-layer cells above shows that voltage developed by tri-layer cells averages about 0.35 volts, whereas the average for bi-layer cells is about 0.31 volts. Thus, the cells having a short-barrier imbedded in the cadmium sulfide layer develop over 10% more voltage than those cells in which the barrier layer is on the outer side of the cadmium sulfide layer.

What is claimed is:

1. A cadmium sulfide photovoltaic cell of improved efficiency comprising successive layers of a transparent conducting electrode layer, a first cadmium sulfide semi-conductor layer, a short-barrier layer comprising cadmium sulfide, said short-barrier layer containing a minor portion of a metal selected from the group consisting of titanium aluminum, chromium, vanadium, boron, magnesium, beryllium and scandium, a second cadmium sulfide semi-conductor layer, a barrier layer and a collecting metal electrode layer.

2. A cadmium sulfide photovoltaic cell of improved efficiency according to claim 1 wherein said transparent conducting electrode layer is tin oxide.

3. A cadmium sulfide photovoltaic cell of improved efficiency according to claim 1 wherein said transparent conducting electrode layer is indium oxide.

4. A cadmium sulfide photovoltaic cell of improved efficiency according to claim 1 wherein said transparent conducting electrode layer is indium-tin oxide.

5. A cadmium sulfide photovoltaic cell of improved efficiency according to claim 1 wherein said short-barrier layer is cadmium sulfide containing a minor proportion of aluminum oxide or aluminum sulfide.

6. a cadmium sulfide photovoltaic cell of improved efficiency according to claim 1 wherein said collecting metal electrode layer is a copper metal electrode.

7. A process for preparing thin film polycrystalline photovoltaic cells of improved efficiency which comprises forming a first cadmium sulfide semiconductor layer on a transparent conducting electrode layer, forming a short-barrier layer comprising cadmium sulfide, said short-barrier layer containing a minor proportion of a metal selected from the group consisting of titanium aluminum, chromium, vanadium, boron, magnesium, beryllium and scandium on said first cadmium sulfide semi-conductor layer, forming a second cadmium sulfide semi-conductor layer on said short-barrier layer, forming a copper sulfide barrier layer on said second cadmium sulfide semi-conductor layer, and forming a copper collecting electrode layer on said copper sulfide barrier layer.

8. A process according to claim 7 wherein the layers are formed by spray deposition.

* * * * *